United States Patent [19]
Gerard et al.

[11] Patent Number: 5,417,769
[45] Date of Patent: May 23, 1995

[54] VAPOR/IMMERSION CLEANING METHOD FOR SOILED PARTS

[75] Inventors: Donald R. Gerard; William J. Hook; Charles A. Pennington; Robert J. Richardson, II, all of Bowling Green, Ky.

[73] Assignee: Detrex Corporation, Southfield, Mich.

[21] Appl. No.: 187,539

[22] Filed: Jan. 28, 1994

Related U.S. Application Data

[63] Continuation of Ser. No. 21,423, Feb. 23, 1993, Pat. No. 5,327,920.

[51] Int. Cl.⁶ .................. B08B 3/00; B08B 3/04; B08B 3/10
[52] U.S. Cl. .................. 134/18; 134/10; 134/11; 134/12; 134/26; 134/35; 134/40; 134/57 R; 134/95.1; 134/102.3; 134/105
[58] Field of Search .................. 134/26, 40, 35, 10, 134/11, 12, 18, 95.1, 57 R, 102.3, 105

[56] References Cited

U.S. PATENT DOCUMENTS

| | | | |
|---|---|---|---|
| 3,216,431 | 11/1965 | White | 134/132 |
| 3,227,629 | 1/1966 | Kearney et al. | 202/170 |
| 3,483,092 | 12/1969 | Young | 203/1 |
| 3,593,727 | 7/1971 | Black | 134/57 |
| 3,610,260 | 10/1971 | Kearney | 134/12 |
| 3,676,307 | 7/1972 | Black | 210/167 |
| 4,055,196 | 10/1977 | Kearney | 134/107 |
| 4,640,719 | 2/1987 | Hayes et al. | 134/40 |
| 4,867,800 | 9/1989 | Dishart et al. | 134/40 |
| 5,075,982 | 12/1991 | Rodgers, Sr. et al. | 134/11 |

Primary Examiner—Melvyn J. Andrews
Assistant Examiner—Zeinab El-Arini
Attorney, Agent, or Firm—Neal A. Waldrop

[57] ABSTRACT

An automated open topped apparatus and improved method for cleaning soil from metal parts which employs a low vapor tension, low density, LVTC, liquid cleaner in a first tank and a high vapor tension, higher density, immiscible rinse, HVTR, liquid in a second tank and a rinse vapor zone above both tanks in the apparatus which provides steps and means for preventing rinse vapor loss during shut down periods by using microprocessor controlled steps that cause a layer of the liquid cleaner to be positioned atop and cover the liquid rinse in its tank and at the end of the idle period returns the liquid cleaner cover to the first tank and re-starts the cleaning process and thereafter monitors and controls cleaning operation until the succeeding shut down period.

5 Claims, 8 Drawing Sheets

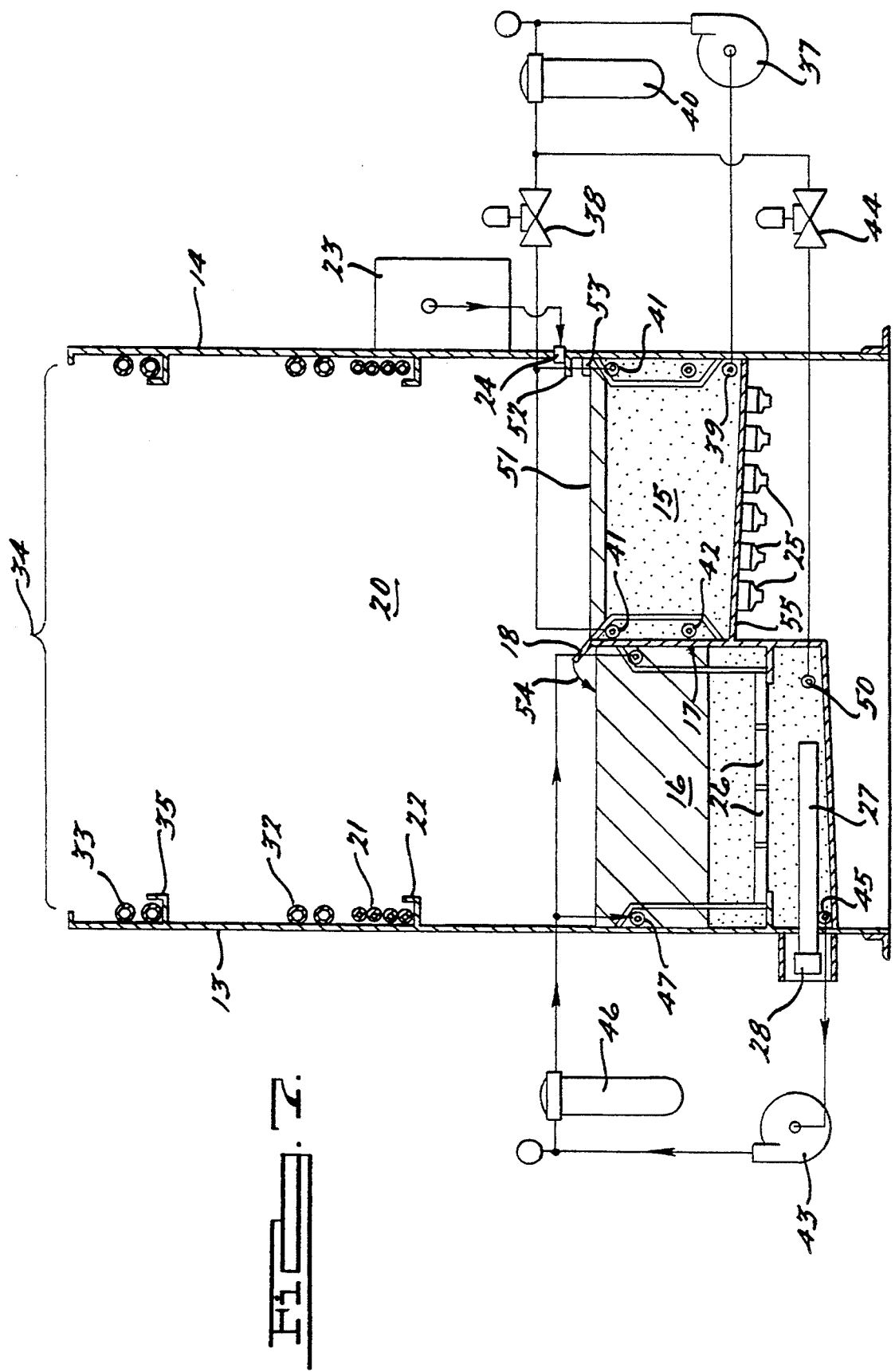

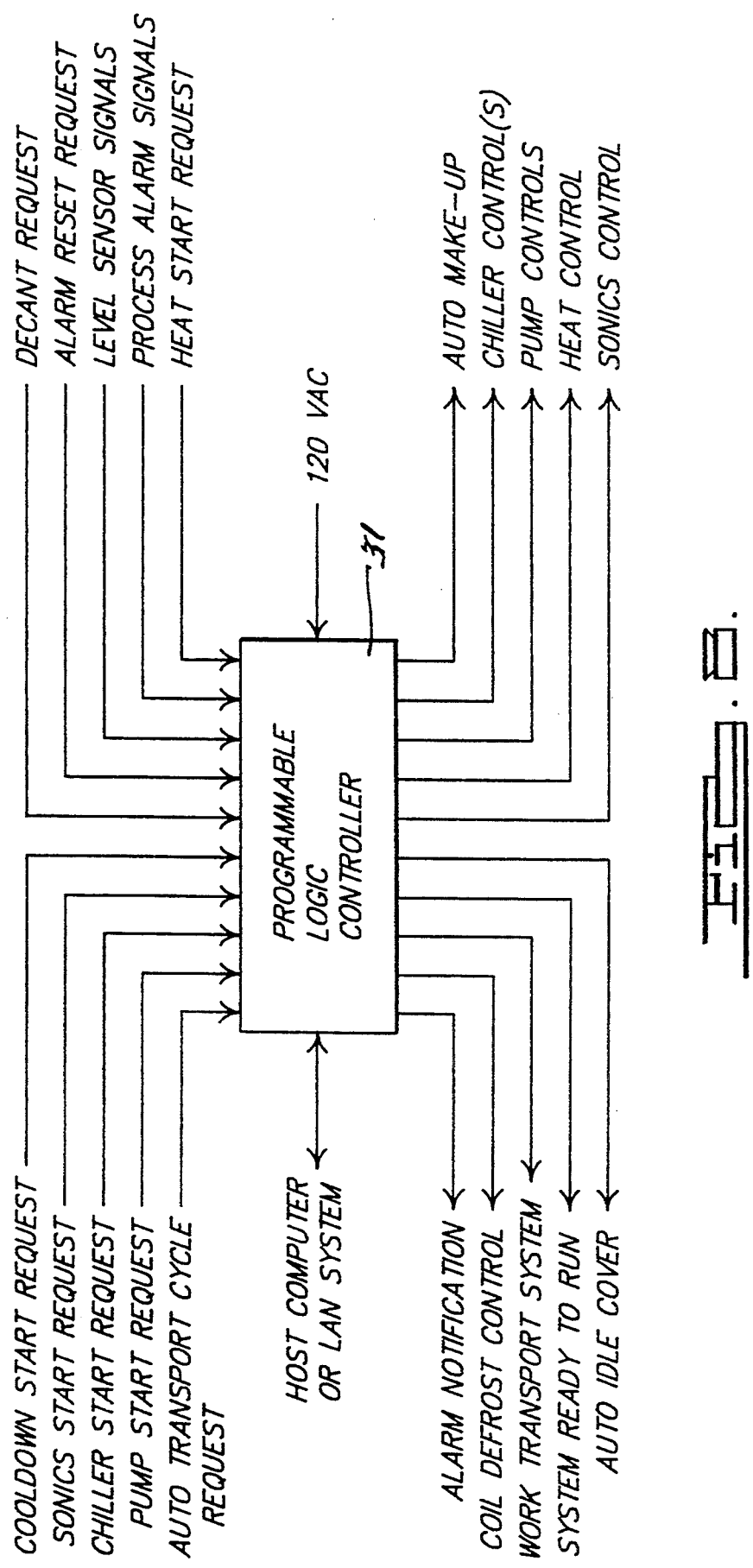

VAPOR/IMMERSION CLEANING METHOD FOR SOILED PARTS

This is a continuation of application Ser. No. 08/021,423, filed on Feb. 23, 1993, now U.S. Pat. No. 5,327,920.

BACKGROUND OF THE INVENTION

This invention relates to vapor/immersion cleaning apparatus of the degreaser type for removing soils such as greases, waxes or the like from metal and other parts which is programmably controlled and a microprocessor controlled method for eliminating undesirable vaporization of expensive and/or toxic solvents from the open topped plural-tank cleaning apparatus during periods of shut down, start up, and normal cleaning operation.

Dry cleaning machines and metal degreasing apparatus having an open top and one or more solvent tanks using a single vaporizable solvent such as trichloroethylene or perchloroethylene had been used in the United States commercially by as early as the mid 1950's. Such apparatus and processes for cleaning metal by vapor phase cleaning, or combinations of vapor phase with immersion cleaning in an agitated solvent, or by agitating the parts while immersed in such solvent, are disclosed in expired U.S. Pat. Nos. 3,216,431 and 3,593,727. By the mid 1960's apparatus having water cooled conduits located peripherally on the walls of open top metal cleaning apparatus for creating a vapor zone above the cleaning liquids and methods for cleaning and for condensing solvent vapors and reusing the condensed solvent were being used commercially. Such apparatus and methods are disclosed in U.S. Pat. Nos. 3,227,629, 3,610,260 and 3,676,307.

The continuing problem of escape of some quantity of solvent vapors from such apparatus continued into the late 1960's and led to improvement in recovery processes by distillation such as is disclosed in U.S. Pat. No. 3,483,092. By the late 1970's low boiling fluorocarbon solvents, or azeotropes thereof with methylene chloride that boiled below 100° F., had been developed along with ultrasonic transducers. Commercial use of the combination of such solvents with the sonic transducers led to the invention of a compression-expansion type refrigeration system and apparatus that improved control of solvent vapor zones and decreased solvent losses. That apparatus and process is disclosed in U.S. Pat. No. 4,055,196, issued Oct. 25, 1977, to Thomas J. Kearney and entitled Immersion Type Metal Degreaser With Compression-Expansion System for Heating and Cooling of Liquid Solvent and Solvent Vapors.

Technical information extant by the mid 1980's that ozone depletion in the atmosphere is partially attributable to the presence of chlorine made metal cleaning with chloro-fluoro hydrocarbons less desirable and has sparked renewed research efforts for identifying and developing substitute solvents for cleaning soil from parts. An effective, no-fail system for eliminating solvent vapor losses in open topped metal cleaning apparatus during shut down times had not been found prior to the present invention.

SUMMARY OF THE INVENTION

The present invention is directed to automated apparatus and a microprocessor controlled process that solves the problem of undesirable release of expensive, or toxic or ozone-depleting solvent vapors into the atmosphere resultant from vapor-immersion cleaning in open topped apparatus of soil from metal, printed circuit boards or other parts, and which apparatus and process can be operated and conducted in a safe economic, commercially feasible manner.

The automated apparatus of this invention is a modified version of the type of degreaser disclosed in U.S. Pat. No. 4,055,196 which is owned by the assignee of the present invention. The new apparatus is similar to that of the '196 patent in certain respects in that it uses side by side boil and vapor distillate tanks separated by a common wall, and incorporates an ultrasonic transducer and a refrigeration system for cooling the liquid solvent and the solvent vapors.

The modifications in the new automated apparatus of this invention have been added to accommodate a process of metal cleaning using two different liquids in the two tanks that are immiscible, that is, a cleaning and rinsing liquid that are chemically dissimilar and which do not dissolve in each other when mixed. The new apparatus adds means to transfer a portion of the immiscible rinse liquid into the cleaning liquid tank by a route, different from the normal cascading route from the rinse tank into the boil tank. The procedure employed and the means added to the apparatus to make the new method possible to accomplish include means which automatically position a covering layer of cleaning liquid of controlled depth over the surface of the liquid in the rinse tank during the shut down period of the cleaning operations. Other means are added to the apparatus enabling re-transfer of the cover layer of cleaning liquid from its position atop the rinse liquid back into the cleaning tank. The microprocessor automatically initiates a start up of the apparatus, and then monitors and controls the cleaning operation which will be more specifically explained in the detailed description hereinafter.

The new process of this invent ion includes new microprocessor controlled steps of cover layer formation and removal which prevents loss of the vapor condensate into the atmosphere during shut down periods of idle time between cleaning operations without requiring the expensive continued operation of the refrigeration components of the apparatus which is ordinarily required to maintain a vapor zone within an open topped degreaser to reduce, or avoid, such losses in order to meet safety requirements. Thus, the new process is cheaper as the result of savings of expensive solvents and the avoidance of refrigeration costs during idle periods.

BRIEF DESCRIPTION OF DRAWINGS

FIG. 7 is similar to FIG. 4 and illustrates the removal of the cover layer by raising the rinse level in the rinse tank to cascade the cleaner cover layer over the dam and back into the boil tank to thus ready the system for normal cleaning operation when the rinse agitation pump is turned on; and FIG. 8 is a schematic block diagram of the programmable logic controller correlating the apparatus elements controlled, and process steps initiated and paramaters monitored and controlled under shut-down, start-up and the various operating modes of the apparatus and process.

BEST MODE FOR CARRYING OUT THE INVENTION

Figure 1:
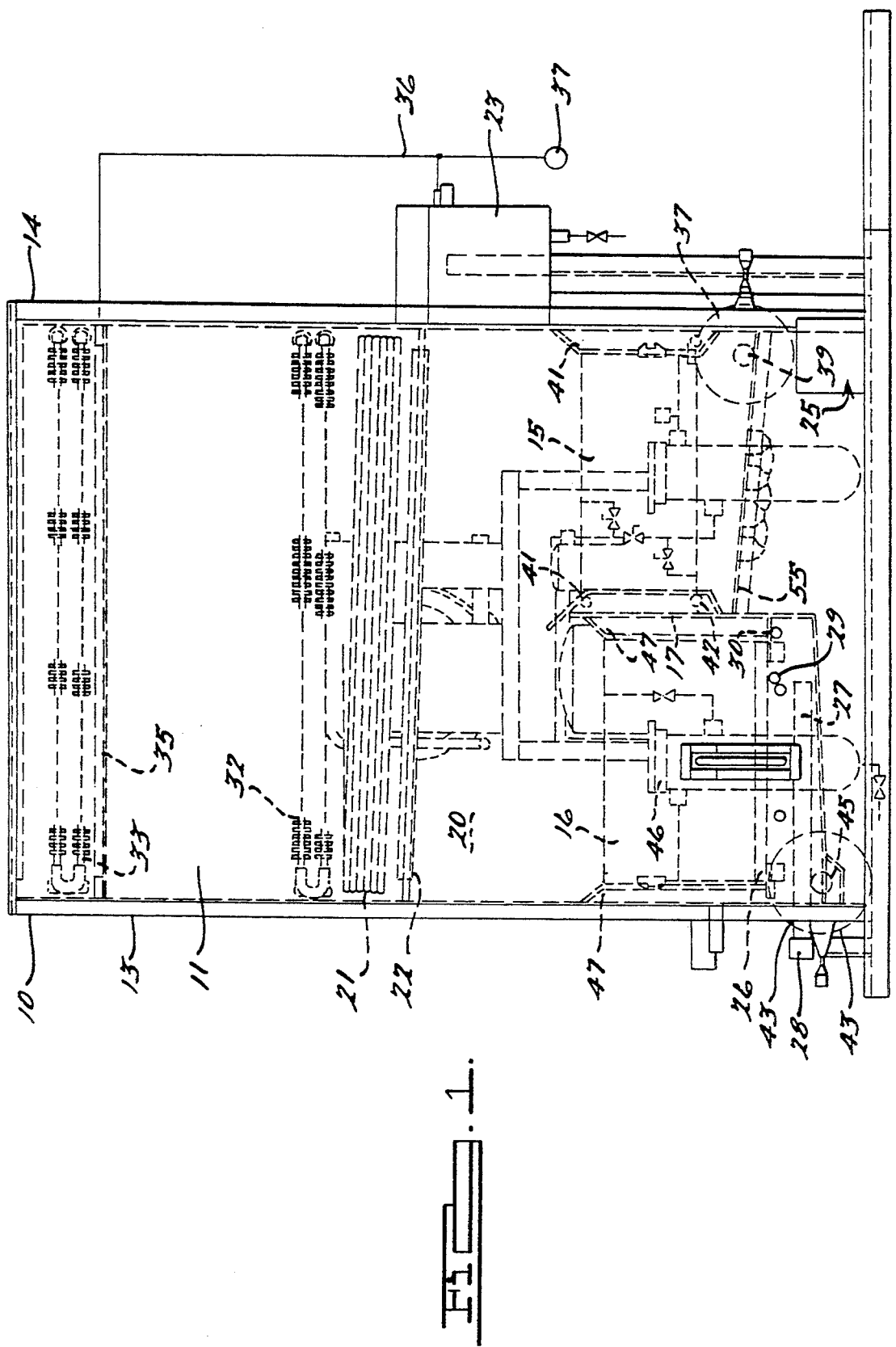
FIG. 1 is a front elevational view of the open top apparatus in accordance with this invention.

As shown in the drawings, the improved apparatus of this invention illustrates an open top modified degreaser which comprises a housing of non-corrosive metal having continuous, flat front wall 11, rear wall 12, left and right end walls 13 and 14. The interior of housing 10 is separated into two tanks or chambers, a rinse chamber 15 and a boil chamber 16. The two chambers are separated by a common partition 17 terminating at its upper end in a dam 18 sloping upwardly from the rinse chamber 15 toward boil chamber 16, the upper edge surface of which establishes the normal level of the rinse liquid during cleaning operations and is the surface over which that liquid rinse continuously cascades into the boil chamber as indicated by arrow 19.

Figure 2:
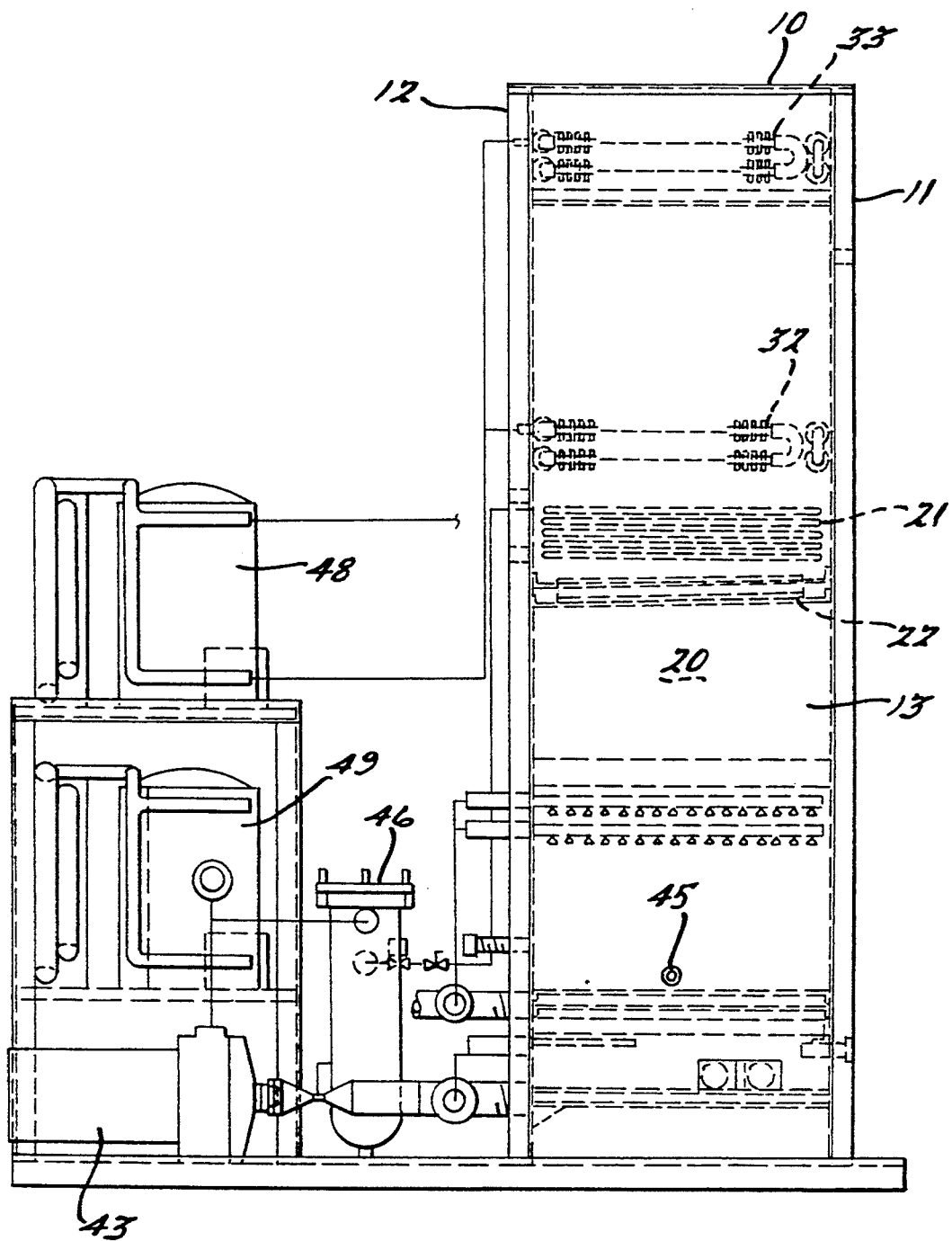
FIG. 2 is a left side elevational view of the apparatus of FIG. 1.
Figure 3:
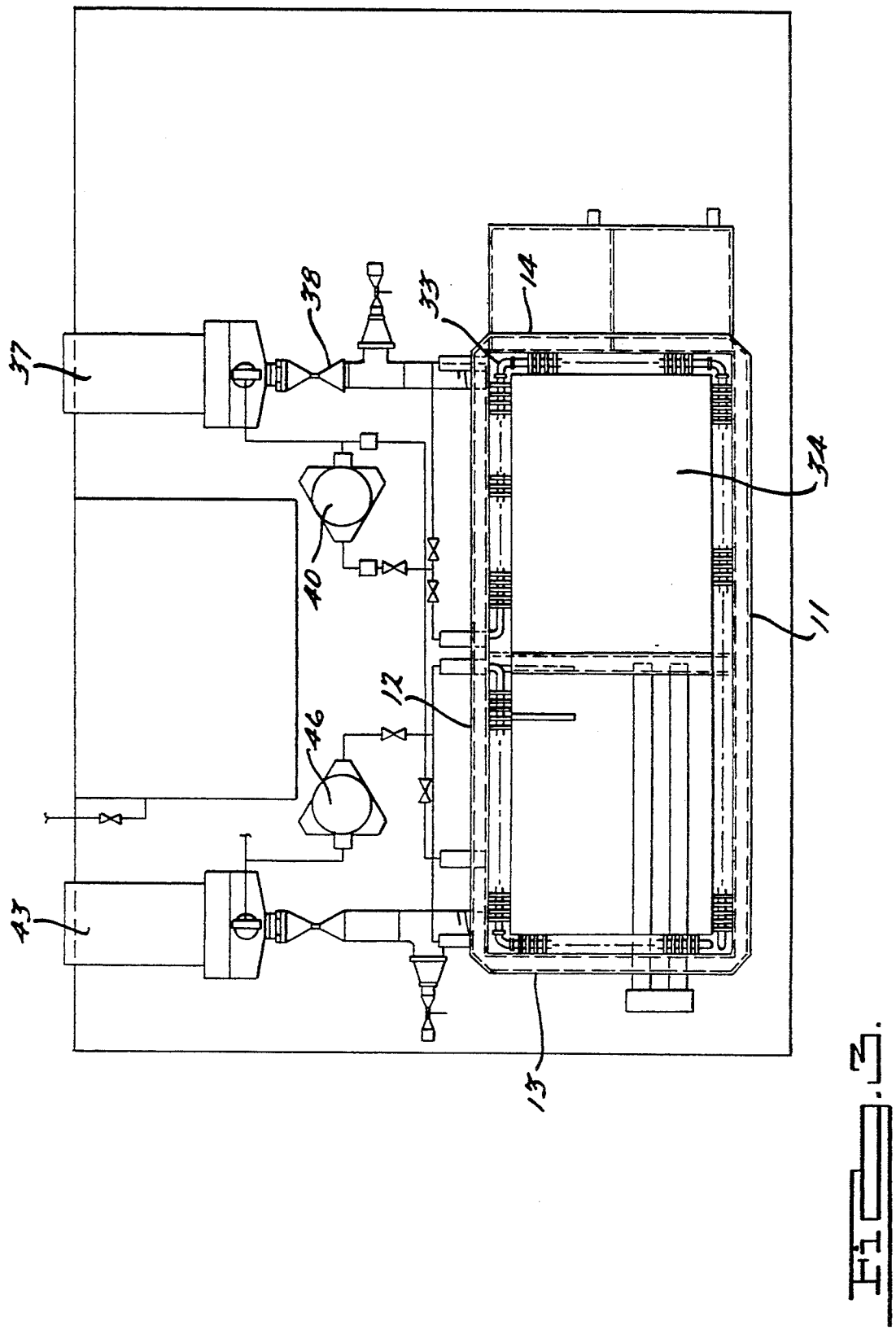
FIG. 3 is a top plan view of the apparatus of FIG. 1.
Figure 4:
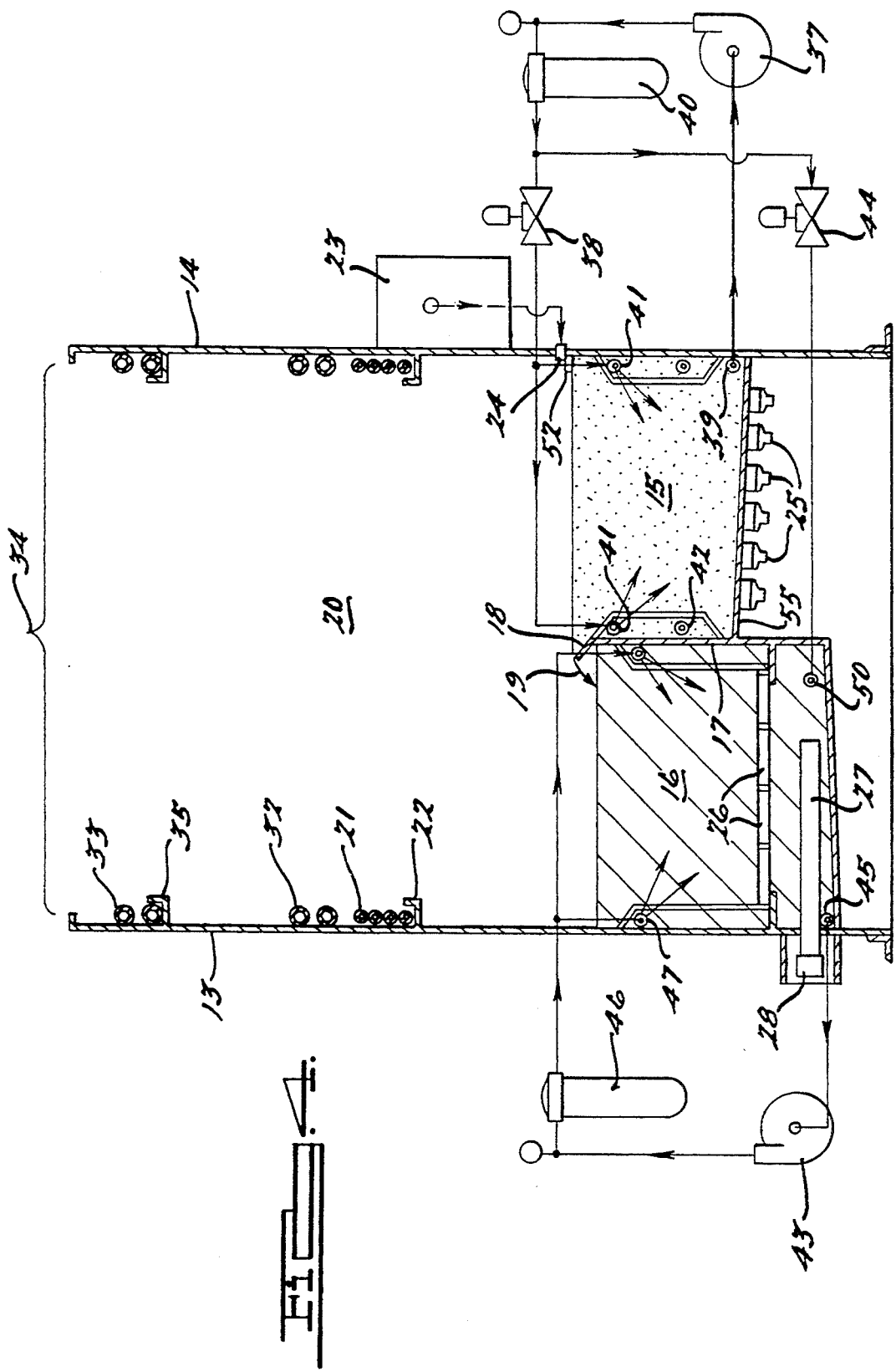
FIG. 4 is a simulated front view of the apparatus of FIG. 1 illustrating normal operating conditions and showing pump and liquid circulation to achieve agitation in both tanks and relative rinse liquid and cleaner liquid levels in tanks 15, 16.
Figure 5:
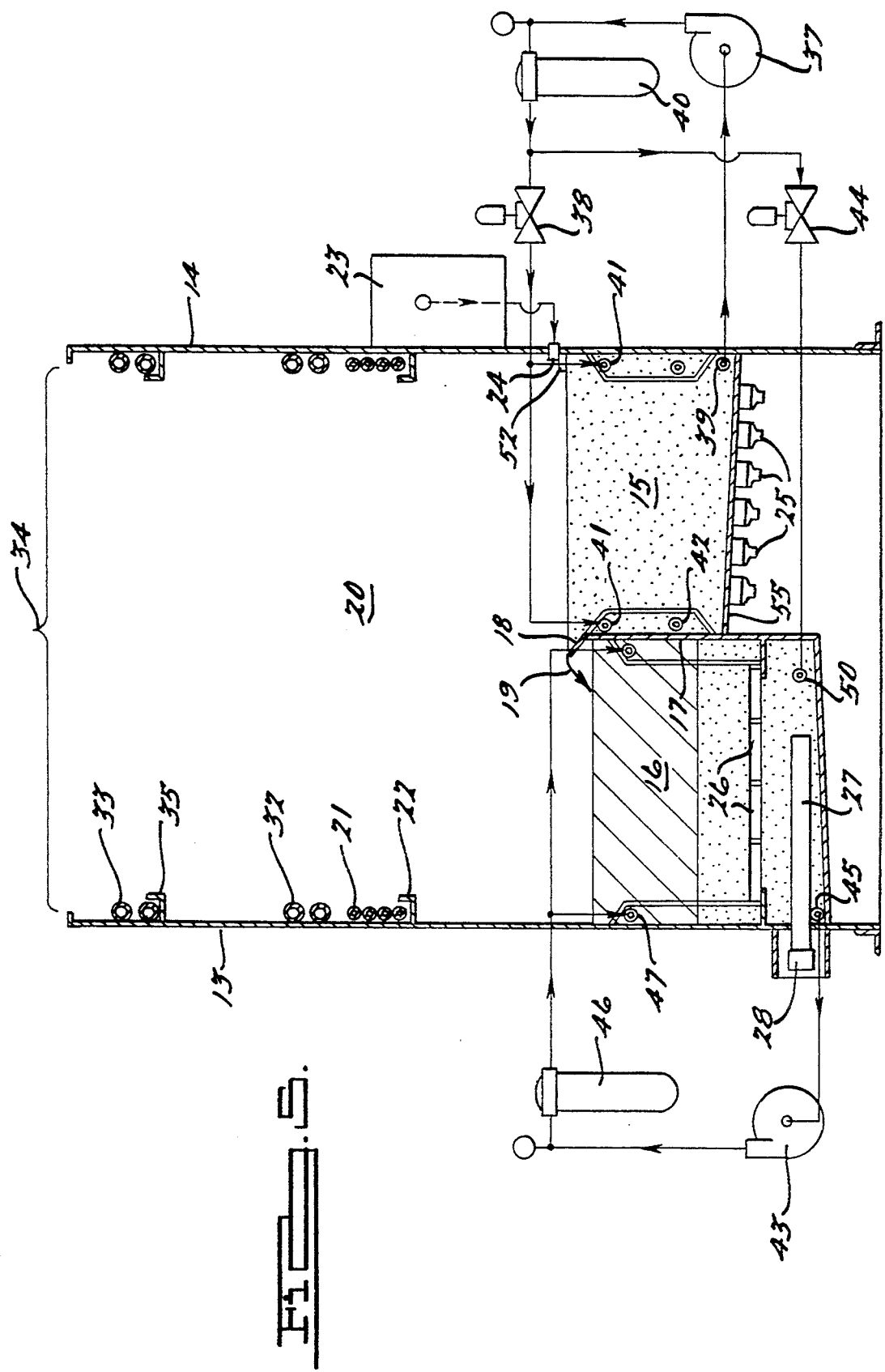
FIG. 5 is a front view similar to FIG. 4 but illustrating the separated rinse liquid underlying the cleaner liquid after pumping agitation has ceased and shortly after shut down with both pumps off.
Figure 6:
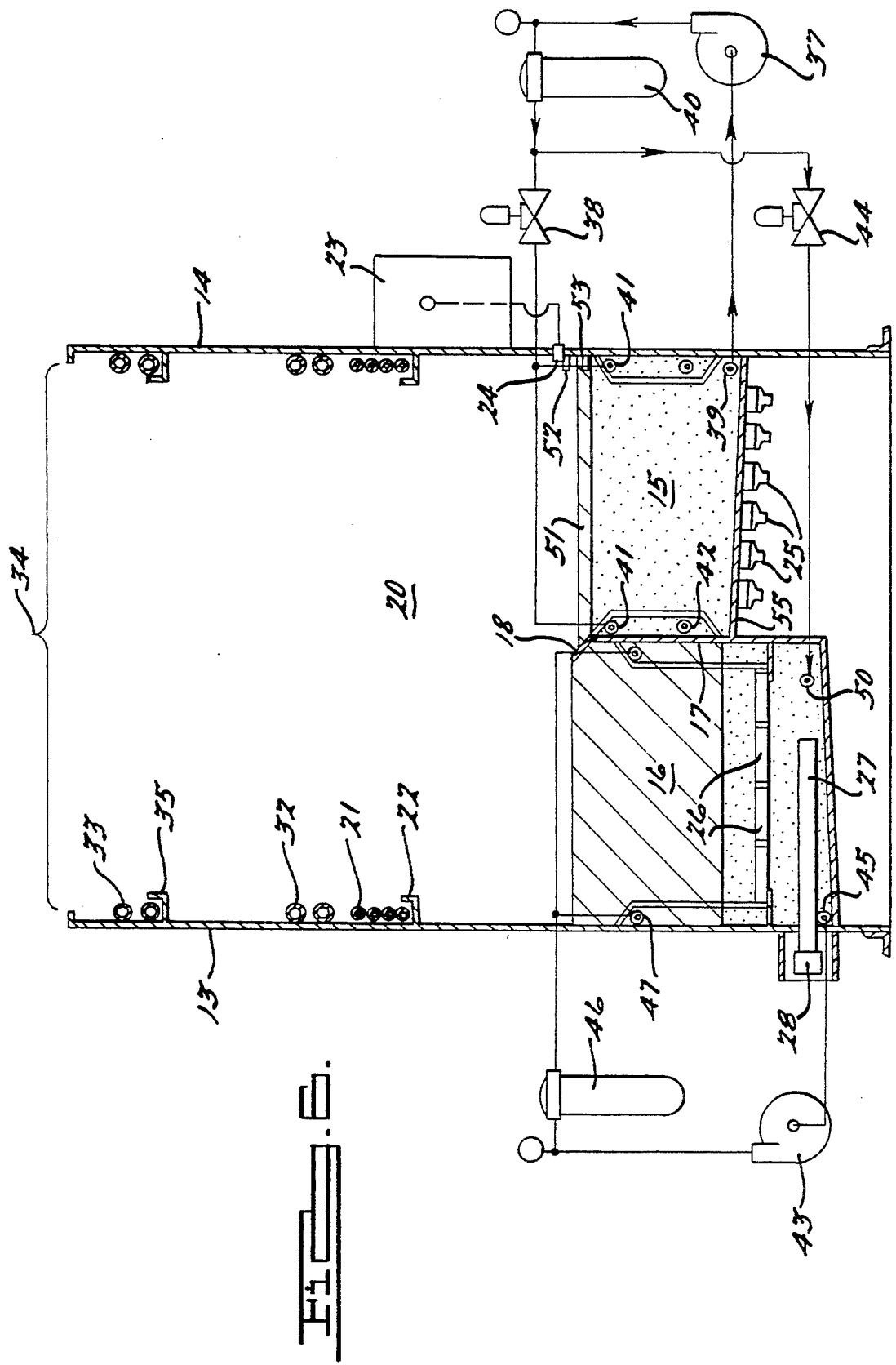
FIG. 6 is a front view similar to FIG. 4 illustrating reversal of solenoid valve 38 to closed and reversal of solenoid valve 44 to open, and with boil tank pump 43 off, the transfer of rinse liquid from the bottom of the rinse tank to the bottom of the boil tank causes the cleaner liquid to rise in level and cascade into the rinse tank to form a liquid cover to the level sensor pre-set depth.

A vapor zone 20 within housing 10 extends between the top of the rinse and boil tanks 15, 16 upwardly to a level preferably no higher than half way up the bank of six primary condenser coils 21, shown in FIG. 1. As shown in FIGS. 2 and 3, the primary coils 21 extend peripherally on the interior surface of each wall and surround the entire vapor zone 20. Immediately beneath primary condensor coils 21 is an inwardly extending trough 22 which collects the vapor condensates. Each wall surface trough slopes downwardly sufficiently to drain all of the distillates into the water separator/rinse distillate receiving tank 23. As best seen in FIGS. 4-6, rinse distillate tank 23 is piped to distillate port 24 which, during operation, empties the distillate directly into rinse tank 15.

This continuously added distillate into tank 15 keeps the rinse liquid at the top level of dam 18 and produces the cascading transfer into boil tank 16. Boiling of the agitated admixture of rinse liquid with the cleaning liquid in tank 16 continuously vaporizes the rinse liquid to form the vapor that occupies vapor phase zone 20, then condenses when cooled and returns to rinse tank 15 as stated.

The sloped bottom 55 of rinse tank 15 supports a plurality of sonic imploders powered by the sonic power assembly 25 which is of conventional type. Suitable equipment of this type includes fixed frequency, adjustable frequency and/or square wave type sonic power sources available from Ultrasonc Power Co., Freeport, Ill. or Crest Ultrasonics Corp., Trenton, N.J.

Boil chamber 16 contains a work rest support 26 which acts as a support surface for baskets of metal or other types of parts being processed in the liquid cleaning solvent contained in chamber 16. A heating element 27 is positioned in chamber 16 beneath work rest support 26 and protected by cover 28. The temperature of the liquids in boil chamber 16 is measured by low temperature thermometer 29 over the range of, for example, 0°–200° F. and by high temperature thermostat 30, both of which are electrically connected to the microprocessor 31, not shown, but located within housing 36 and graphically depicted in block diagram, FIG. 8.

A programmable logic controller, PLC, having functional capabilities including counters, sequencers, timers, relay logic and shift registers, and containing a processor, CUP and capacitor-backed CMOS RAM memory, such as is commercially available in the United States from Allen-Bradley, Milwaukee, Wis. under the designation SLC TM 150 Programmable Controller is suitable for use to automate the apparatus and to initiate, monitor, and control the steps of the process of this invention.

An overall block diagram is shown in FIG. 8 of the apparatus and process requests, notifications as to operating parameters monitored and controlled, within pre-set limits, to accomplish the cleaning operation mode as illustrated in FIG. 4; to accomplish the shut-down condition prior to liquid cover formation and placement of the liquid cover over the rinse liquid as illustrated in FIG. 5; to accomplish the automatic placement of liquid cover over the rinse liquid as illustrated in FIG. 6, and to accomplish the removal of the liquid cover by replacement of the cleaner liquid into the boil chamber 16 and start up as illustrated in FIG. 7.

The portion of the interior of housing 10 above the primary condenser coil bank 21 is provided with two additional sets of chiller/dehumidification coils which serve, during operation of the cleaning process, to maintain low ambient temperatures in the freeboard zone above the primary coils 21 and thus reduce, and ideally preclude, rinse vapor losses from the open topped apparatus and into the atmosphere. In the illustrated apparatus of FIGS. 1–3, the first double coil set of freeboard chilling coils 32 is located immediately above the primary condenser coils 21 and rinse vapor distillate or ambient air moisture that condenses on these coils falls into trough 22 and is discharged into rinse distillate tank 23 through port 24. The second set of chiller/dehumidification coils 33 is located closely adjacent to the open top 34 of housing 10. Distillates that form on the coils 33 are collected in trough 35 and transferred through pipes 36 to receiving tank 23 or discarded directly through a waste water exit.

The chiller/dehumidification coil sets 32, 33 normally operate at approximately −20° F. whereas primary condenser coils 21 normally are maintained at approximately 40° F. The desired temperatures are monitored and controlled within pre-set limits by the microprocessor 31, not shown.

Agitation of the rinse solutions in tank 15 is obtained from the circulation of rinse liquid by pump 37, connected by piping through solenoid valve 38, controlled by microprocessor 31 and programmed to be normally open during cleaning operation. Rinse is withdrawn from the bottom area of tank 15 through port 39, and passes through filter 40 and discharges through spray headers 41 and eductor nozzles 42 angled downwardly and inwardly to enhance agitation in addition to that supplied by the sonic imploders 25. A similar pump and piping arrangement is used in agitating the cleaning liquid in boil tank 16 and includes pump 43, withdrawal port 45, filter 46 and injects liquid downwardly and inwardly into spray headers 47 positioned near the normal operating level of the cleaning liquid in tank 16.

Due to the immiscibility of the cleaning and rinse liquids used in the process of this invention it is important to assure sufficient agitation of the continuously cascading rinse liquid into the cleaning liquid in the boil chamber to enable efficient vaporization of the rinse to form and maintain the vapor blanket in vapor space 20 overlying both tanks 15, 16. As soiled metal parts are lowered through the open top and freeboard zone into the vapor zone above the tanks, the hot vapor assists soil removal by heating and softening the soil as it approaches the work rest support 26 upon immersion in the cleaning liquid in boil tank 16. Cleaning during immersion first in the boil tank cleaner and later upon immersion in the rinse solution is also somewhat assisted by the agitation within the cleaning and/or rinse liquids.

As indicated above, the improved process of this invention solves the problem of loss of highly volatile vapor phase materials during shut down periods in the operation of the open top, two tank metal cleaning apparatus above described. The process applies to solvents referred to above, generally, as cleaning liquids and rinsing liquids and there are numerous and varied specific materials in each category. Such materials resulted from research for non-toxic, non ozone-depleting replacement materials for chlorinated hydrocarbons that have been discouraged for use as cleaning solvents for environmental reasons since about the middle 1980's.

The preferred process of this invention is concerned with the use of cleaner and rinse liquids which are immiscible with each other and which quickly stratify into easily discernible layers readily visible to the naked eye. The cleaner liquid should be capable of dissolving, dislodging or solvating the soil to be removed. Additionally, the rinse liquid is preferably easily converted from liquid into vapor by heating an admixture of the rinsing and cleaning liquids by boiling that admixture, The rinse, or vapor phase forming component, is typically a low boiling point material that volatilizes easily, and hereinafter, and in the claims, will be identified as a high vapor tension rinse liquid, HVTR liquid. Vapor tension is the tendency of a liquid to form a vapor and high vapor tension as herein used refers to liquids which at room temperature and sea level pressure are highly volatilizable and usually have boiling temperatures below about 140° F. The rinse liquid, and or rinse in vapor form, aids in, and serves to remove and clean the solvated soil from the metal or other part being cleaned of soils which are typically greases, oils or waxes and may include adhesives, rosins or rosin fluxes on printed circuit boards.

The process of this invention is specifically concerned with preventing the loss of the high vapor tension rinse liquid by volatilization at room temperature from a rinse tank in the apparatus of this invention during shut down periods. The process accomplishes that result in two microprocessor controlled steps; (1) positioning a cover layer of low vapor tension cleaner liquid over the upper surface of high vapor tension rinse, HVTR liquid in the rinse tank at shut down of the cleaning operation in the apparatus of this invent ion; and (2) removing the cover layer and re-starting the cleaning operation of the apparatus.

The low vapor tension cleaner material preferably has a substantially higher boiling point than the high vapor tension rinse material, and ideally, does not vaporize at all, or to any appreciable degree, at the boiling point, or vaporization temperature, of the rinse material when the admixture with the cleaning liquid is boiled. Hereinafter, and in the claims, the cleaner or cleaning liquid in the boil tank will be referred to as a low vapor tension cleaner liquid, LVTC liquid. In a preferred embodiment of this invention, illustrated in greater detail in connection with FIGS. 4–7 hereinbelow, in addition to immiscibility of the HVTR and LVTC liquids, it is desirable for the LVTC liquid to have a lower density than the HVTR liquid and in selecting particular combinations it is preferable to select HVTR and LVTC materials having a wide difference in density.

The improved method of this invention of preventing loss of high vapor tension rinse liquid is not restricted to any specific material, or combination, or composition but rather is applicable for use with any combination of cleaner and rinse materials that have been identified in any of numerous prior art patents such as, for example, Hayes et al U.S. Pat. No. 4,640,719 which discloses cleaning rosin solder flux from printing wiring boards by using terpene compounds, and Dishart et al U.S. Pat. No. 4,867,800 which discloses using dibasic ester solvents in combination with a terpene compound. Rodgers et al U.S. Pat. No. 5,075,982 discloses low boiling point HCFC solvents for use in open top defluxer apparatus as replacements for the ozone depleting solvents CFC-113 and these HCFC solvents are materials that appear to be included within the category of high vapor tension rinse HVTR liquids suitable for use with an immiscible low vapor tension cleaner LVTC liquid that may include terpenes of the Hayes '719 patent or the combinations of the Dishart '800 patent.

The microprocessor controlled steps of the method of this invention can be best understood in connection with the representation of the constituent phases of the automated cycle of operation of the apparatus that is illustrated in FIGS. 4–7 of the drawings that will now be explained.

FIG. 4 is a schematic front view representation of the apparatus of FIG. 1 illustrating the pump and piping layout including the microprocessor controlled solenoid valves that functionally enable the automatic placement of a cover layer of the LVTC liquid over the top surface of the HVTR liquid in the rinse tank at shut down of an operating condition cycle of the apparatus. FIG. 4 shows the HTVR liquid at the level of the top of dam 18 and cascading over that dam into boil tank 16 as shown by arrow 19. The LVTC liquid level in boil tank 16 is below dam 18, typically approximately 2" below the level of the HVTR liquid.

Agitation of the HVTR liquid is provided by pump 37 which is on and pumping HVTR liquid as shown by the arrows on the simulated piping from port 39 through filter 40 and HVTR liquid is ejected downwardly and inwardly into the upper portion of the HVTR liquid through spray headers 41 and into the mid-portion through eductor nozzles 42, with the agitation within the LVTC liquid being further enhanced by sonic agitation as previously mentioned.

Boil tank agitation results from withdrawal of LVTC liquid through port 45 by pump 43, through filter 46 and is discharged through spray headers 47. Heating element 27 is on and boiling occurs, typically in the range monitored by the microprocessor between 100° F. and 200° F. that is appropriate for the particular LVTC liquid being used.

FIG. 5 is a schematic front view of the apparatus of FIG. 4 at a time shortly after shut-down has been initiated, the pumps 37, 43 are off and agitation has ceased. The HVTR liquid is at dam 18 level, heat to element 27 is off and the LVTC liquid in boil tank 16 has cooled somewhat and stratified above the separated HVTR liquid which is shown beneath the LVTC liquid.

FIG. 6 illustrates the process step of forming a liquid cover layer of LVTC liquid over the surface of the HVTR liquid in the rinse tank 15. The formation step is initiated by the microprocessor closing rinse tank solenoid 38 and opening solenoid 44. Pump 37 is then activated to withdraw HVTR liquid from the bottom port 39 and to transfer that liquid into the bottom port 50 in boil tank 16 at a rate insufficient to agitate the LVTC strata in tank 16. That transfer is continued under microprocessor control until the LVTC liquid is raised to the level of dam 18 and cascades into tank 15 to form a cover layer 51 to the pre-set level of the top level sensor 52 which signals the microprocessor to de-energize pump 37. Thereafter, the refrigeration provided by units 48 and 49, shown in FIG. 2, to the primary cooling coils 21, and the free board chiller coils 32 and dehumidifier coils 33 stops, as preprogrammed.

FIG. 7 illustrates the automated steps of the process that occur at the end of the shut down period when a decision to restart the apparatus has been made. The first step is a microprocessor response to a signal from the low level limit sensor 53 of the cover layer 51.

That sensor 53 is located at the low level limit of cover layer 51. Its position reflects the normal lowering of the cover layer level, approximately 2" due to the decrease in liquid volumes resulting from cooling from the temperature near boiling at shut-down time to the cooler temperature at start-up time. Such sensor 53 activation of the microprocessor initiates pump means to supply HVTR liquid make-up from an auxiliary supply tank, not shown, in sufficient quantity to reposition the top surface of the cover layer 51 at the initial level of top level sensor 52, which then deactivates the pump means and signals the microprocessor that start-up steps may be effected.

These start-up steps include de-energizing the cool-down selector switch, energizing the main disconnect switch, start refrigeration units 48, 49, turn on the boil tank pump 43, turn on heat to element 27. When the admixture of HVTR and LVTC liquids reach boiling, vapor of HVTR fills the vapor zone 20, vapor condenses on primary coils 21, the distillate flows through distillate tank 23 and empties into rinse tank 15. As the quantity of distillate into tank 15 increases, the HVTR level rises and pushes the cover layer 51 upward and causes it to cascade over dam 18 back into boil tank 16 as indicated by arrow 54. When the layer 51 is completely removed and repositioned in tank 16, and HVTR begins to cascade again over dam 18, the microprocessor activates rinse tank pump 37 thus re-establishing operating conditions for processing soiled metal parts under the monitoring controls of the microprocessor 31 as described in connection with FIG. 4.

What is claimed is:

1. A microprocessor controlled cyclical process of solvent cleaning soils from parts in an open top apparatus comprising a cleaning mode cycle and a shut down cycle, said apparatus having a boil tank containing an agitated admixture of high vapor tension rinse liquid and low vapor tension cleaner liquid and a rinse tank containing high vapor tension rinse liquid and a vapor space overlying said tanks into which high vapor tension rinse vapor rises and condenses and the high vapor tension rinse distillate circulates into said rinse tank and cascades continuously from said rinse tank into said boil tank over the upper end of the common wall separating said tanks during operation of said cleaning mode cycle, said cleaning mode cycle comprising the steps of:

(1) immersing soiled parts in said agitated admixture in said boil tank to remove soil therefrom, and (2) transferring said parts from said boil tank into said vapor space overlying said tanks and rinsing same in said high Vapor tension rinse vapors therein, and during said shut down cycle of said process preventing losses of high vapor tension rinse vapors from said rinse tank comprising the microprocessor controlled step of positioning a layer of said low vapor tension cleaner liquid over the surface of said high vapor tension rinse liquid in said rinse tank.

2. A process in accordance with claim 1 wherein said low vapor tension cleaner layer is formed by using a portion of said low vapor tension cleaner liquid in said boil tank.

3. A process in accordance with claim 1 wherein said low vapor tension cleaner layer is formed by cascading a portion of said low vapor tension cleaner liquid over the upper end of said common wall separating said boil and rinse tanks.

4. A process in accordance with claim 1 wherein said low vapor tension cleaner cover layer is established in position atop said high vapor tension rinse liquid in said rinse tank by microprocessor controlled steps comprising:

(1) terminating agitation of the admixture of low vapor tension cleaner and high vapor tension rinse liquids in said boil tank and forming a separated layer of low vapor tension cleaner liquid overlying a layer of high vapor tension rinse liquid in the lower portion of said boil tank, (2) terminating the agitation of the high vapor tension rinse liquid in said the rinse tank, (3) pumping high vapor tension rinse liquid from the bottom portion of said rinse tank into the lower portion of said boil tank and directly into the stratified high vapor tension rinse liquid layer in said lower portion of said boil tank, (4) continuing the pumping of step (3) to cause the stratified layer of low vapor tension cleaner liquid overlying said high vapor tension rinse liquid to rise to the level of the upper end of said common wall separating said boil and rinse tanks and to cascade into said rinse tank and to form a covering layer over said high vapor tension rinse liquid, and (5) sensing the arrival of low vapor tension cleaner liquid at the desired top level for said cover layer and by signal to said microprocessor initiating de-energization of the pump means to thereby stop pumping high vapor tension rinse liquid initiated in step (3).

5. A process in accordance with claim 1 including microprocessor controlled steps for removing said low vapor tension cleaner cover layer from its position atop the high vapor tension rinse liquid in said rinse tank during said shut-down cycle comprising agitating the said low vapor tension cleaner and high vapor tension rinse liquids in said boil tank and heating said admixture to boiling to distill high vapor tension rinse vapors into said vapor space, condensing said vapors, collecting said distillate and delivering said distillate into said rinse tank in sufficient quantity to raise the level of high vapor tension rinse liquid to thereby raise said low vapor tension cleaner layer to the top of said common wall separating said boil and rinse tanks and cascade the low vapor tension cleaner liquid in said layer into said boil tank in its entirety and thereafter initiating agitation of the high vapor tension rinse liquid in said rinse tank to thereby start up said cleaning mode cycle of said process.

* * * * *